US012033960B1

(12) United States Patent
Abdel-Dayem

(10) Patent No.: US 12,033,960 B1
(45) Date of Patent: Jul. 9, 2024

(54) SEMICONDUCTOR PACKAGE WITH STIFFENER RING HAVING ELEVATED OPENING

(71) Applicant: Amazon Technologies, Inc., Seattle, WA (US)

(72) Inventor: Bassam Abdel-Dayem, Santa Clara, CA (US)

(73) Assignee: Amazon Technologies, Inc., Seattle, WA (US)

( * ) Notice: Subject to any disclaimer, the term of this patent is extended or adjusted under 35 U.S.C. 154(b) by 227 days.

(21) Appl. No.: 17/548,325

(22) Filed: Dec. 10, 2021

(51) Int. Cl.
| | |
|---|---|
| *H01L 21/50* | (2006.01) |
| *H01L 23/00* | (2006.01) |
| *H01L 23/34* | (2006.01) |
| *H01L 23/367* | (2006.01) |
| *H01L 23/498* | (2006.01) |

(52) U.S. Cl.
CPC ............ *H01L 23/562* (2013.01); *H01L 21/50* (2013.01); *H01L 23/34* (2013.01); *H01L 23/3675* (2013.01); *H01L 23/49833* (2013.01)

(58) Field of Classification Search
CPC . H01L 23/562; H01L 23/34; H01L 23/49833; H01L 23/3675; H01L 21/50
See application file for complete search history.

(56) References Cited

U.S. PATENT DOCUMENTS

| | | | | |
|---|---|---|---|---|
| 7,787,250 | B2* | 8/2010 | Li ............................ | H01L 23/04 361/720 |
| 11,658,127 | B2* | 5/2023 | Goh .................. | H01L 23/49805 257/659 |
| 2008/0099866 | A1* | 5/2008 | Chang ............... | H01L 27/14685 257/433 |
| 2008/0099891 | A1* | 5/2008 | Kato ....................... | H01L 24/97 257/706 |
| 2012/0182694 | A1* | 7/2012 | Lin ......................... | H01L 23/16 361/728 |
| 2012/0306031 | A1* | 12/2012 | Lo .......................... | G01L 19/143 257/E21.501 |
| 2015/0102478 | A1* | 4/2015 | Suthiwongsunthorn ..................... | H01L 24/73 257/680 |
| 2015/0162307 | A1* | 6/2015 | Chen ....................... | H01L 21/56 438/107 |

* cited by examiner

Primary Examiner — Alonzo Chambliss
(74) Attorney, Agent, or Firm — Kilpatrick Townsend & Stockton LLP

(57) ABSTRACT

A stiffener ring can include a body sized for attachment to a substrate in a semi-conductor package. The stiffener ring body can have a top surface and a bottom surface. A through-hole may penetrate the body so as to extend through the top surface and the bottom surface and so that the body is formed as ring around the through-hole. An anchor surface can form a portion of the bottom surface and be configured for engaging the substrate. An elevated surface can also form a portion of the bottom surface and be elevated above the anchor surface.

18 Claims, 3 Drawing Sheets

SEMICONDUCTOR PACKAGE WITH STIFFENER RING HAVING ELEVATED OPENING

BACKGROUND

In semiconductor manufacturing, a package may correspond to a suitable container and/or assembly for holding a semiconductor die. The package may protect the die, dissipate heat, connect the die to other dice or components, and/or perform other important functions.

In fabrication of semiconductor packages, sizing of components and/or spacing among components can be important factors. For example, in some scenarios, shifting from one size of substrate to another size of substrate that is incrementally larger (such as expanding the size by 5 mm in each direction to change from a 65 mm×65 mm size to a 70 mm×70 mm size) may be accompanied by a doubling or other drastic increase in the cost of the package. In addition, foundries or other producers may have particular rules about minimum spacing that may be permitted between respective components, such as to facilitate fabrication, for example. Designs of packages accordingly may often be constrained by sizing and/or spacing considerations.

BRIEF DESCRIPTION OF THE DRAWINGS

Various embodiments in accordance with the present disclosure will be described with reference to the drawings, in which.

DETAILED DESCRIPTION

Figure 1:
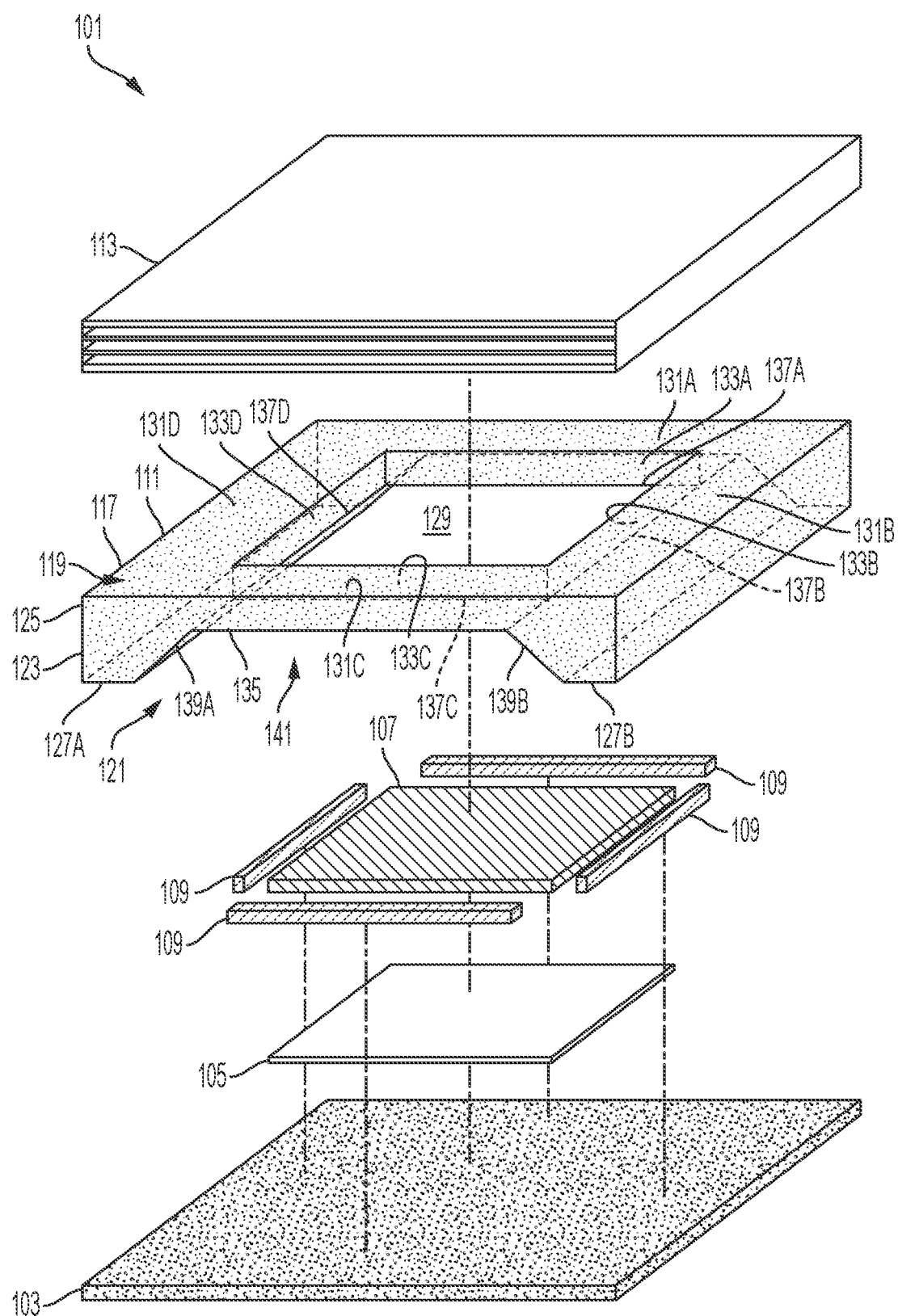
FIG. 1 illustrates an exploded assembly view of elements of a semiconductor package in accordance with various embodiments.

Various examples described herein are directed to systems or techniques relating to semiconductor packages. The semiconductor packages can include stiffener rings. The stiffener rings may include raised and/or elevated portions, e.g., which may permit improved spacing of components on the substrate to which the stiffener ring is attached. For example, the elevated portions may be raised out of contact with the substrate underneath and thus provide space in which other components attached to the substrate may extend without encroaching on other laterally adjacent portions of the stiffener ring or other components. In this manner, guidelines or rules regarding minimum distancing between components may apply relative to other components instead of an inner edge of the stiffener ring (e.g., which may be positioned away from a relevant area). As a result, stiffener rings with elevated portions may afford additional space or area in which components can be arranged in comparison to arrangements in which stiffener rings without elevated portions are utilized. For example, a die of a given size may be able to fit on a substrate that is a smaller size (and thus more economical) than if a corresponding stiffener ring did not have the corresponding raised or elevated portions.

In an illustrative example, the elevated portion may resemble a roof of a tunnel extending through or along an underside of the stiffener ring. The stiffener ring may have a vertical opening extending downward through the stiffener ring, e.g., intersecting the path of the tunnel. A die or other components may be arranged to extend away from a center of the vertical opening and to extend within the tunnel, e.g., in or near a portion that is under a solid part of the tunnel roof.

In another example, the stiffener ring may include a vertical opening that may define opening sidewalls that bound the edge of the opening. Bottom edges of the opening sidewalls may be suspended or otherwise positioned at an elevated position relative to the substrate, such as being positioned above an upper extremity of a die or discrete components positioned on the substrate. The vertical opening may define a cross-sectional area, and the elevated position of the bottom edges of the opening sidewalls may provide space underneath such that the cross-sectional area may avoid being a boundary constraint to a size of a die or other components that can be positioned on the substrate. As an illustrative example, an opening may be 70 mm×70 mm and may be consistent with fitting a die of 65 mm×65 mm (e.g. such that a 2.5 millimeter border is maintained around outer edges of the die). Having the raised portions of the stiffener room may allow a larger die (such as a 72×72 mm die) to be positioned below the opening and extending beneath raised portions of the stiffener ring without encroaching beyond proximity limits relative to other parts of the stiffener ring nearby.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

FIG. 1 illustrates an example of a semiconductor package 101. The package 101 is depicted with a substrate 103, an interposer 105, a die 107, discrete components 109, a stiffener ring 111, and a superstructure 113, although other combinations of fewer, more, or different elements may be utilized. In use, the package 101 may be borne by a motherboard contained within a server assembly, for example. The package 101 is also shown in an assembled state in a side view and a top view respectively in FIG. 2 and FIG. 3.

The substrate 103 can correspond to suitable structure for receiving other components. The substrate 103 may be the substrate portion of a chip-on-wafer-on-substrate (CoWoS) assembly, for example. The substrate 103 may include silicon or other suitable materials. The substrate 103 may be a particular size such as 65 mm×65 mm, 65 mm×70 mm, 70 mm×70 mm, or other size that may be utilized in producing the package 101 or other packages. The substrate 103 can include connections sized, for example, on a micro-meter scale or otherwise suitably sized for connection with the interposer 105.

The interposer 105 may include a suitable body with elements that can allow connection between the substrate 103 and the die 107. The interposer 105 may be the wafer portion of a chip-on-wafer-on-substrate (CoWoS) assembly, for example. The interposer 105 may include suitable features for spreading a connection from the die 107 to a wider pitch for interoperability with the substrate 103. In some examples, the interposer 105 on an upper side includes connections sized on a nano-meter scale for connection with the die 107 and on a lower side includes connections sized on a micro-meter scale for connection with the substrate 103. The different scales of connections may be coupled via tracings or other suitable structures extending within the interposer 105, for example.

The die 107 may be mounted on top of the interposer 105. The die 107 may be the chip portion of a chip-on-wafer-on-substrate (CoWoS) assembly, for example. Although the die 107 is shown as a single die 107 by way of example, other arrangements are possible. The die 107 can include any suitable number of dice, including one, two, three, or more than three. The die 107 can include any suitable type of die 107 individually or in combination. Examples of suitable types can include any type of integrated circuit, for example, memory dice, compute dice, logic dice, accelerators, and application-specific integrated circuits (ASICs). The die 107 can include connection features at a specific scale suitable for engaging the interposer 105, for example. The die 107 can include connections sized on a nano-meter scale or otherwise suitably sized for connection with the interposer 105.

The discrete components 109 can correspond to capacitors or resistors or other discrete components that may be installed on the substrate 103 and/or on the interposer 105. The discrete components 109 are each depicted as elongate, bar-shaped components but may correspond to sets of one or more individual components of any smaller, larger, or other suitable form factor. Typically, the individual discrete components such as capacitors or resistors are smaller than the die 107. Moreover, although four discrete components 109 are shown, any other number may be utilized (e.g., including one, two, three, four, or more than four). The discrete components 109 may be subject to spacing rules relative to the die 107 and/or other elements of the package 101. The stiffener ring 111 can include suitable structure for reinforcing the package 101.

The stiffener ring 111 can include metal or other suitable material. The stiffener ring 111 can include suitable geometry and mass for resisting warpage or otherwise satisfying loading criteria of the package 101. Generally speaking, a component referred to herein as a "ring" does not necessarily have a round shape; instead, such a ring may be round, square, rectangular, or another shape.

The superstructure 113 may include any suitable structure to be mounted atop the stiffener ring 111. The superstructure 113 is depicted as a heat sink, but may include fins, fans, cooling conduits, and/or any other superstructure that may be at least partially attached to and/or supported by the stiffener ring 111 in use.

With respect to structure, the stiffener ring 111 can include a body 117. The body 117 may be suitably sized for attachment to the substrate 103. The body 117 can include a top surface 119 and a bottom surface 121.

The body 117 can include an attachment base 123 and an elevated ring layer 125. In use, the attachment base 123 may include suitable structure for mounting on the substrate 103. For example, the attachment base 123 is depicted as two tapered legs that extend between the elevated ring layer 125 and the substrate 103, although other numbers may be utilized. The attachment base 123 may include an anchor surface 127, which may form a portion of the bottom surface 121. For example, the anchor surface 127 may extend along the feet of the attachment base 123 or otherwise engage the substrate 103 in use. The anchor surface 127 may engage the substrate 103 via adhesive or any other suitable fastening technique.

The elevated ring layer 125 is shown atop the attachment base 123. The elevated ring layer 125 and the attachment base 123 are shown as integrally formed from a single monolithic mass of material, although composite construction with coupled separate subcomponents is also possible. The elevated ring layer 125 may include the top surface 119 of the stiffener ring 111.

An opening 129 can extend vertically through the stiffener ring 111. For example, the opening 129 can extend through the elevated ring layer 125 and through the attachment base 123. The opening 129 can correspond to a through-hole, which may penetrate the body 117 so as to extend through the top surface 119 and the bottom surface 121.

The body 117 may be formed as a ring around the opening 129. For example, the body 117 may be formed of a group of four ring segments 131 (e.g., individually labeled 131A, 131B, 131C, and 131D in FIG. 1). The ring segments 131 can be arranged in a loop to define and/or laterally bound the opening 129. For example, the ring segments 131 can each be arranged along a different lateral side of the opening 129.

The opening 129 may define opening sidewalls 133 (e.g., individually labeled 133A, 133B, 133C, and 133D in FIG. 1). The opening sidewalls 133 may define a perimeter of the opening 129 and/or may laterally bound the opening 129. For example, the opening sidewalls 133A, 133B, 133C, and 133D may correspond to four downwardly extending rim walls arranged so that each rim wall is positioned along a different lateral side of the opening 129. The opening sidewalls 133 may extend from and to and/or between the top surface 119 and the bottom surface 121 of the stiffener ring 111.

The stiffener ring 111 can also include an elevated surface 135. The elevated surface 135 may form a portion of the bottom surface 121 of the stiffener ring 111. The elevated surface 135 may be elevated above the anchor surface 127. The opening sidewalls 133 may include bottom edges 137 along the opening 129, and at least one of the bottom edges 137 may form a portion of the elevated surface 135. For example, as may be appreciated from the side view in FIG. 2, the stiffener ring 111 may be positioned in an installed state so that at least one bottom edge 137 of the opening sidewalls 133 is positioned above an uppermost extremity of the die 107 and/or above discrete components 109. At least one bottom edge 137 additionally or alternatively may be positioned aligned with or below an uppermost extremity of the die 107 and/or discrete components 109, or at any other suitable elevated position relative to the substrate 103.

Various instances of features may be separated from one another by the opening 129. For example, referring again to FIG. 1, the elevated surface 135 may include bottom edges 137A and 137C of opening sidewalls 133A and 133C that are arranged across from one another (e.g., on opposite sides of the opening 129 from one another). As another example, the elevated surface 135 may include bottom edges 137B and 137D of opening sidewalls 133B and 133D that are arranged across from one another (e.g., on opposite sides of the opening 129 from one another). The elevated surface 135 may include first and second elevated surfaces, which may correspond to the spaced apart bottom edges 137A and 137C, for example. As another example, the anchor surface 127 may include a first anchor surface and a second anchor surface separated from each other by the opening 129 and arranged on the respective legs of the attachment base 123.

The bottom surface 121 may include a suitable profile for extending over the substrate 103 in use. For example, the bottom surface 121 may include a transition surface 139. The transition surface 139 may extend from the anchor surface 127 to the elevated surface 135. Although the transition surface 139 is shown as a straight angled surface arranged at an acute angle relative to horizontal, the transition surface 139 may be otherwise sloped (e.g., extending at an acute angle, a right angle, or an obtuse angle). The transition surface 139 additionally or alternatively may correspond to a concave, convex, or other curved or rounded surface or include any other suitable transition geometry between the anchor surface 127 and the elevated surface 135. The body 117 may include multiple transition surfaces 139. For example, the body 117 may include an outer side wall having a bottom boundary that extends along a first anchor surface 127A, a first transition surface 139A, an elevated surface 135, a second transition surface 139B, and a second anchor surface 127B.

The body 117 of the stiffener ring 111 may additionally or alternatively define different perimeters that may pertain to the elevated surface 135 and the anchor surface 127. For example, the body 117 may define an inner perimeter bounding the opening 129, and at least a portion of a lower edge of the inner perimeter (e.g., along the bottom edges 137 of the opening sidewalls 133) may be above the anchor surface 127. The body 117 additionally or alternatively may define an outer perimeter along an outer periphery of the body 117. The outer perimeter at least in part may contact or be supported by the substrate 103. For example, at least a portion of a lower edge of the outer perimeter may extend to the anchor surface 127.

The body 117 may include a tunnel 141. The tunnel 141 may extend through opposite outer side walls of the body 117, for example. The tunnel 141 may be arranged so that its roof corresponds to the elevated surface 135, for example. The tunnel 141 may intersect the opening 129. The die 107 and the discrete components 109 can be arranged within the tunnel 141 in use. Although the tunnel 141 is shown with open ends, in some embodiments, ends of the tunnel 141 may be closed off with a filler material or portion of the stiffener ring 111.

Figure 2:
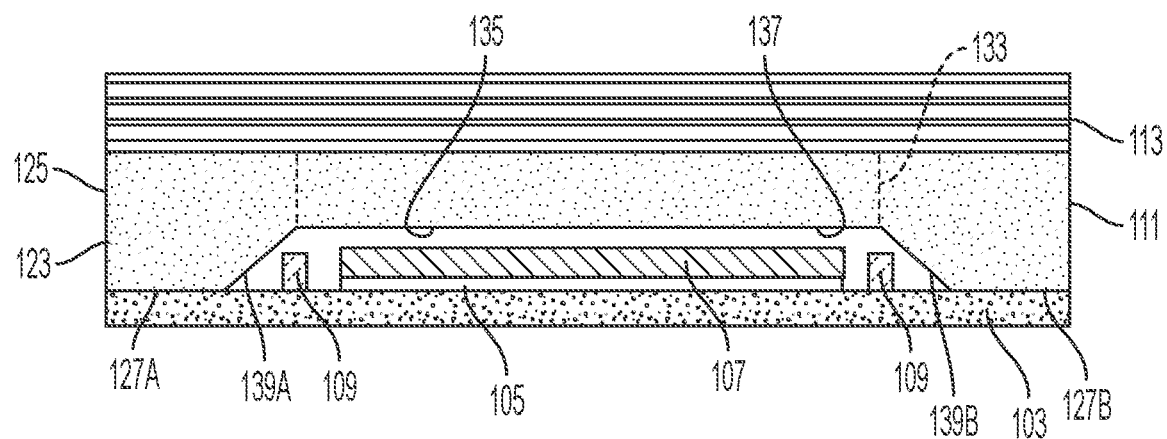
FIG. 2 illustrates a side view of the package of FIG. 1 in accordance with various embodiments.

As may be best seen in FIG. 2, the elevated surface 135 of the stiffener ring 111 can be positioned above the die 107 and/or over the discrete components 109. Positioning above may include vertically offset without any lateral offset (e.g., directly overhead) or with some degree of lateral offset (e.g., both laterally offset and vertically offset).

Figure 3:
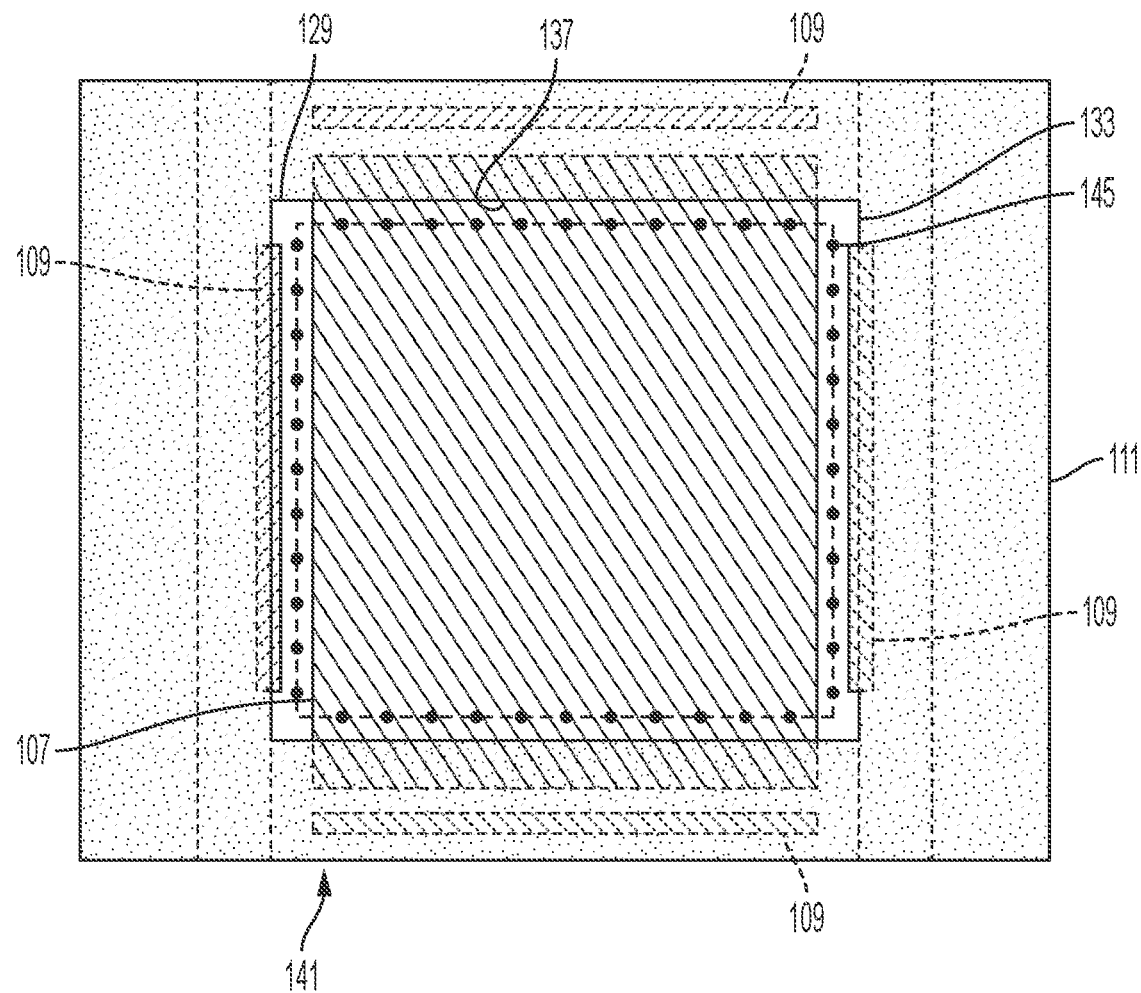
FIG. 3 illustrates a top view of the package of FIG. 1 in accordance with various embodiments.

As may be best seen in FIG. 3, portions of the die 107 and/or the discrete components 109 may be arranged to extend laterally beyond a perimeter of the opening 129. This may correspond to extending underneath a bottom edge 137 of the opening sidewalls 133, for example. This may also correspond to the stiffener ring 111 overhanging at least one of the die 107 or a discrete component 109 spaced from the die 107 and mounted on the substrate 103.

As may also be appreciated with respect to FIG. 3, including the tunnel 141 may provide additional space for mounting components along the substrate 103 in comparison to if the tunnel 141 were absent. For example, if the opening sidewalls 133 of the opening 129 extended directly downward into engagement with the substrate 103 in an installed state, a boundary 145 such as depicted by the dot dash line might be established (e.g., where the boundary 145 is laterally offset inward from the opening sidewalls 133 in accordance with rules for maximum distance from adjacent components). Yet, the presence of the tunnel 141 permits extension and/or arrangement of components outside of the boundary 145, such as at least partially under portions of the tunnel 141 (e.g., as may be seen with the discrete components 109 at left and right in FIG. 3 and the die 107 extending underneath an edge of the opening 129 in FIG. 3) and/or fully under portions of the segment (e.g., as may be seen with the discrete components 109 along top and bottom of the view in FIG. 3). Moreover, although components are shown extending underneath the edges of the opening 129 in FIG. 3, arrangements may additionally or alternatively include components that are arranged outside the boundary 145 yet inward from edges of the opening 129. In addition, although only one tunnel 141 is shown (e.g., extending along one direction of the stiffener ring 111), more than one tunnel 141 may be utilized (such as with tunnels 141 extending along perpendicular or otherwise differing directions of the stiffener ring 111 or otherwise intersecting or parallel to one another).

The stiffener ring 111 may include any suitable combination of geometry along the top surface 119 and/or the bottom surface 121. For example, although the stiffener ring 111 in FIG. 1 is shown with the top surface 119 substantially defining a plane between opposite lateral extremities of the stiffener ring 111, embodiments are not limited to such an arrangement. One variation from the geometry shown in FIG. 1 is shown in FIG. 4 by way of example.

Figure 4:
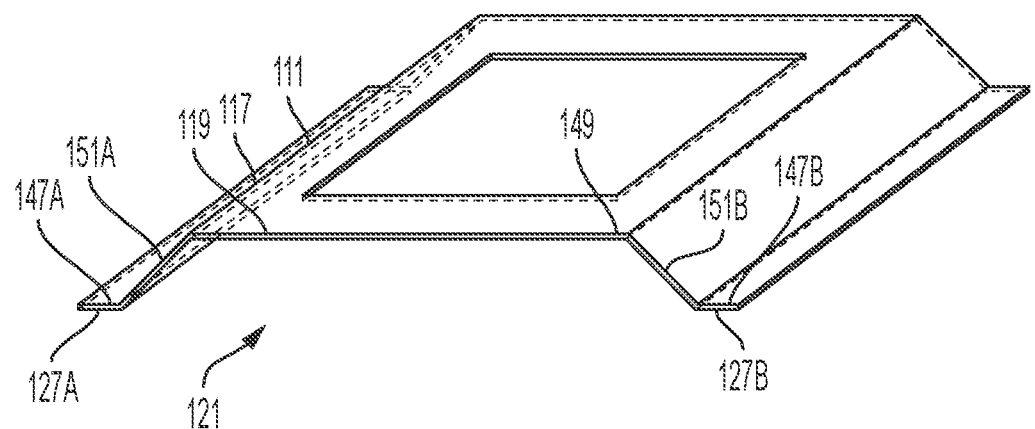
FIG. 4 illustrates a perspective view of a stiffener ring that may be utilized in the package of FIG. 1 in accordance with various embodiments.

In FIG. 4, the top surface 119 of the stiffener ring 111 is arranged to include differences in elevation among different portions of the top surface 119. For example, the top surface 119 may include a first lower upper surface 147A and/or a second lower upper surface 147B positioned lower than a top upper surface 149. The first lower upper surface 147A and the second lower upper surface 147B may be respectively located over the anchor surfaces 127A and 127B, for example. Suitable upper transition surfaces 151 may also be present. For example, in FIG. 4, the body 117 is shown with an outer side wall having an upper boundary that extends along the first lower upper surface 147A, a first upper transition surface 151A, the top upper surface 149, a second upper transition surface 151B, and the second lower upper surface 147B. In some embodiments, respective portions of the top surface 119 and the bottom surface 121 may be arranged so that the stiffener ring 111 is substantially a uniform thickness between the top surface 119 and the bottom surface 121 (such as in instances in which the stiffener ring 111 is stamped or formed from a uniform thickness of material). However, any suitable profile may be utilized. For example, although the upper transition surfaces 151 are each shown as a straight angled surface arranged at an acute angle relative to horizontal, the upper transition surfaces 151 may be otherwise sloped (e.g., extending at an acute angle, a right angle, or an obtuse angle). The upper transition surfaces 151 additionally or alternatively may correspond to a concave, convex, or other curved or rounded surface or include any other suitable transition geometry between a respective lower upper surface 147 and the upper top surface 149.

Any suitable relative sizing and/or spacing among different components may be utilized. One example is shown in FIG. 5, although other dimensions may be utilized.

Figure 5:
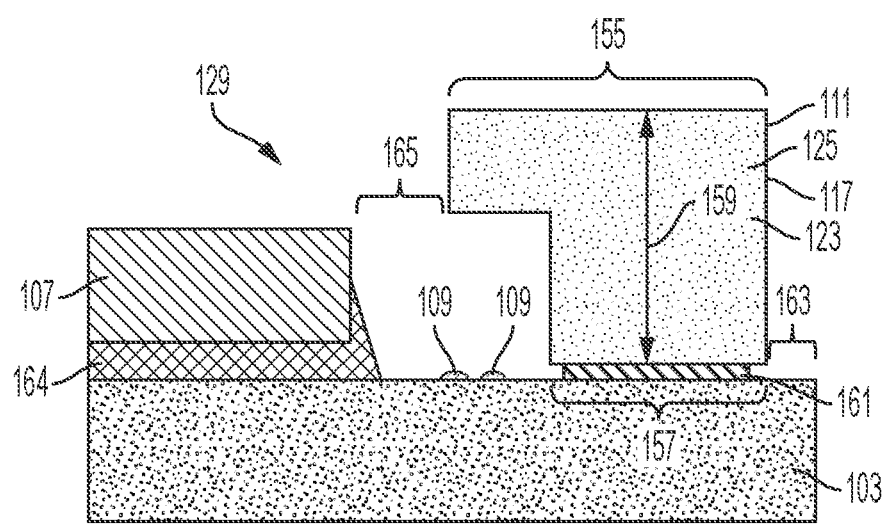
FIG. 5 illustrates a partial side view that shows examples of sizing and spacing relative to a stiffener ring that may be utilized in the package of FIG. 1 in accordance with various embodiments.

FIG. 5 illustrates a partial side view that shows examples of sizing and spacing relative to a stiffener ring 111 that may be utilized in the package 101. The stiffener ring 111 may be sized so that an upper width 155 of the elevated ring layer 125 (e.g., from an inner perimeter about the opening 129 to an outer perimeter along an outer periphery of the body 117) may be 4.7 mm or other suitable size. The stiffener ring 111 may be sized so that a lower width 157 of the attachment base 123 (e.g., from an inner perimeter about the opening 129 to an outer perimeter along an outer periphery of the body 117) may be 3 mm or other suitable size. The stiffener ring 111 may be sized so that an overall height 159 (e.g., including the attachment base 123 and the elevated ring layer 125) may be 4 mm or other suitable size (which may include or exclude any height from any adhesive or other fastener 161 used to couple the stiffener ring 111 to the substrate 103). The stiffener ring 111 may be placed so that the outer periphery of the body 117 is spaced away from an outer edge of the substrate 103 by an outer edge offset 163 of 0.2 mm or other suitable distance. The stiffener ring 111 may be placed so that the inner perimeter about the opening 129 in the body 117 is laterally spaced away from the die 107 (e.g., which may be on underfill 164) by an inner edge offset 165 of 1 mm or other suitable distance. Further, although, the stiffener ring 111 in FIG. 5 is shown at least partially overhanging discrete components 109, any part of the upper width 155 of the elevated ring layer 125 may extend or not extend over discrete components 109 (if present) and/or over the die 107 and/or interposer 105 (if present).

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A server assembly, comprising:
    a motherboard; and
    a semiconductor package borne by the motherboard, the package comprising:
        a substrate mounted on the motherboard;
        a die mounted on the substrate; and
        a stiffener ring comprising:
            an attachment base mounted on the substrate; and
            an elevated ring layer atop the attachment base, the elevated ring layer comprising an opening extending vertically through the attachment base, the opening laterally bounded by four downwardly extending rim walls arranged so that each rim wall is positioned along a different lateral side of the opening, wherein at least two of the rim walls are elevated rim walls having bottom edges arranged at an elevated position out of contact with the substrate, and wherein the stiffener ring comprises a sloped, rounded, or angled transition surface extending away from the bottom edge of the opening and toward the substrate.

2. The server assembly of claim 1, wherein the elevated rim walls comprise a first elevated rim wall and a second elevated rim wall arranged on opposite sides of the opening from one another.

3. The server assembly of claim 1, wherein the bottom edges of the elevated rim walls are arranged above or aligned with an uppermost extremity of the die.

4. The server assembly of claim 1, wherein the die is mounted on the substrate via an interposer positioned between the die and the substrate.

5. A semiconductor package, comprising:
    a substrate;
    a die mounted on the substrate; and
    a stiffener ring mounted on the substrate, the stiffener ring comprising an opening defined vertically therethrough so as to define opening sidewalls, the opening sidewalls defining a perimeter of the opening, wherein the stiffener ring is positioned so that at least one bottom edge of the opening sidewalls is positioned above the substrate, and wherein the stiffener ring comprises a sloped, rounded, or angled transition surface extending away from the bottom edge of the opening and toward the substrate.

6. The semiconductor package of claim 5, wherein the stiffener ring further comprises a tunnel formed along an underside of the stiffener ring and intersecting the opening.

7. The semiconductor package of claim 5, wherein the die is mounted on the substrate via an interposer positioned between the die and the substrate.

8. The semiconductor package of claim 5, further comprising discrete components mounted on the substrate and spaced apart from the die.

9. The semiconductor package of claim 5, wherein the stiffener ring overhangs at least one of the die or a discrete component spaced from the die and mounted on the substrate.

10. The semiconductor package of claim 5, wherein the die is included in a group of multiple dies supported by the substrate.

11. The semiconductor package of claim 5, further comprising a heat sink mounted on the stiffener ring.

12. A stiffener ring, comprising:
- a body sized for attachment to a substrate in a semiconductor package and having a top surface and a bottom surface;
- a through-hole penetrating the body so as to extend through the top surface and the bottom surface and so that the body is formed as ring around the through-hole;
- an anchor surface forming a portion of the bottom surface and configured for engaging the substrate; and
- an elevated surface forming a portion of the bottom surface and elevated above the anchor surface, wherein the bottom surface further comprises a sloped, rounded, or angled transition surface extending from the anchor surface to the elevated surface.

13. The stiffener ring of claim 12, wherein the elevated surface includes a first elevated surface and a second elevated surface separated from one another by the through-hole.

14. The stiffener ring of claim 12, wherein the anchor surface includes a first anchor surface and a second anchor surface separated from one another by the through-hole.

15. The stiffener ring of claim 14, wherein the body comprises an outer side wall having a bottom boundary that extends along the first anchor surface, a first transition surface, the elevated surface, a second transition surface, and the second anchor surface.

16. The stiffener ring of claim 12, wherein the body defines an inner perimeter bounding the through-hole, and wherein at least a portion of a lower edge of the inner perimeter is above the anchor surface.

17. The stiffener ring of claim 12, wherein the body defines an outer perimeter along an outer periphery of the body, and wherein at least a portion of a lower edge of the outer perimeter extends to the anchor surface.

18. The stiffener ring of claim 12, wherein the body comprises a tunnel extending through opposite outer side walls of the body.

* * * * *